United States Patent
Nakajima et al.

[11] Patent Number: 5,856,934
[45] Date of Patent: Jan. 5, 1999

[54] DIGITAL FILTER SYSTEM

[75] Inventors: Michio Nakajima, Osaka; Weimin Sun, Kunitati, both of Japan

[73] Assignee: Icom Incorporated, Osaka, Japan

[21] Appl. No.: 827,407

[22] Filed: Mar. 27, 1997

[30] Foreign Application Priority Data

Aug. 30, 1996 [JP] Japan .................................. 8-231001

[51] Int. Cl.$^6$ .................................................. G06F 17/10
[52] U.S. Cl. ...................................................... 364/724.011
[58] Field of Search .......................... 364/724.011, 724.1, 364/724.19

[56] References Cited

U.S. PATENT DOCUMENTS 5,479,362  12/1995  Sun et al. .
5,530,660   6/1996  Sun et al. .
5,687,109  11/1997  Lane et al. ........................ 364/724.011

*Primary Examiner*—Tan V. Mai
*Attorney, Agent, or Firm*—Frishauf, Holtz, Goodman, Langer & Chick

[57] ABSTRACT

Constants $\{P_{b00i}, Q_{b00j}, \ldots, P_{ak2i}, Q_{ak2j}, P_{ci}, Q_{cj}, P_{di},$ and $Q_{dj}\}$ for calculating each of filter coefficients $\{a_{k1}, a_{k2}, b_{00}, b_{k1}, b_{k2}, c$ and $d\}$ for a digital filter 15 by using non-linear polynomials for pass band position data x and pass band width data y are stored in a memory 13. The constants $\{P_{b00i}, Q_{b00j}, \ldots, P_{ak2i}, Q_{ak2j}, P_{ci}, Q_{cj}, P_{di},$ and $Q_{dj}\}$ are determined by using the least square method so that the sum of the square of the errors between the filter coefficients calculated by using non-liner polynomials and the filter coefficients of digital filter having known characteristics becomes the least or the minimum. A CPU 11 calculates the filter coefficients non-linearly by using the constants stored in the memory 13, and sets the results to the digital filter 15 when new pass band position data x or pass band width data y is input at knobs SC and SW.

10 Claims, 5 Drawing Sheets

DIGITAL FILTER SYSTEM

BACKGROUND OF THE INVENTION

1. Field of the Invention

The present invention relates to a digital filter system, more particularly, to a digital filter system which can change the position of the pass band and/or the width of the pass band.

2. Description of the Related Art

Band Pass type digital filters are adapted to various technical fields, and recently, digital filter systems which can vary the position (the central frequency, and the upper and lower limit frequency) and/or the width of the pass band have been proposed.

For example, the U.S. Pat. Nos. 5,479,362 and 5,530,660, which is the divisional application of the former patent, disclose a variable central frequency type band pass filter system shown in FIG. 6. As shown, the variable central frequency type band pass digital filter system comprises:

an N order band pass digital filter 121 for filtering an input digital signal in accordance with filter coefficients $\{a_{k1}, a_{k2}$ and $b_{k1}\}$ ($k=1, 2, \ldots, N/2$; N is an even number), and for outputting the filtered signal;

a first memory 113 for storing filter coefficients $\{a_{k1}(f_a), a_{k2}(f_a)$ and $b_{k1}(f_a)\}$ and $\{a_{k1}(f_b), a_{k2}(f_b)$ and $b_{k1}(f_b)\}$ of known band pass digital filters having a constant band pass width whose center frequencies are $f_a$ and $f_b$, and filter coefficients $\{a_{k1}(f_r), a_{k2}(f_r)$ and $b_{k1}(f_r)\}$ of the known band pass digital filter having a constant pass band width whose center frequency is $f_r$;

a second memory 115 for storing linear coefficients $K_{akj}$ and $K_{bk1}$, which are calculated in accordance with equations (1) and (2) by using the filter coefficients stored in the first memory 113;

$$K_{akj}=[a_{kj}(f_b)-a_{kj}(f_a)]/(f_b-f_a)$$

$$k=1,2,\ldots, N/2\ j=1,2 \qquad (1)$$

$$K_{bk1}=[b_{k1}(f_b)-b_{k1}(f_a)]/(f_b-f_a)$$

$$k=1,2,\ldots N/2 \qquad (2)$$

displacement setting means SV for setting displacement $m\Delta f$ between target center frequency and the predetermined center frequency $f_r$ of said band pass digital filter 121;

multiplication means 117 for obtaining $m\Delta f \cdot K_{akj}$ and $m\Delta f \cdot K_{bk1}$ by multiplying the displacement $m\Delta f$, supplied from said displacement setting means SV, by the linear coefficients $K_{akj}$ and $K_{bk1}$ stored in said second memory 115;

adding means 119 for obtaining $a_{k1}(f_r)+m\Delta f \cdot K_{ak1}$, $a_{k2}(f_r)+m\Delta f \cdot K_{ak2}$, and $b_{k1}(f_r)+m\Delta f \cdot K_{bk1}$ by adding the products obtained by said multiplication means 117, to a corresponding one of the filter coefficients stored in said first memory 113; and setting means 111 for setting the central frequency of said band pass digital filter 121 to $f_r+m\Delta f$ by setting the values $a_{k1}(f_r)+m\Delta f \cdot K_{ak1}$, $a_{k2}(f_r)+m\Delta f \cdot K_{ak2}$, and $b_{k1}(f_r)+m\Delta f \cdot K_{bk1}$, obtained by said adding means 119, as the filter coefficients $\{a_{k1}, a_{k2}$ and $b_{k1}\}$ of said band pass digital filter 121.

The Patent also discloses a variable band width type band pass digital filter system.

This variable band width type band pass digital filter system, as shown in FIG. 6, comprises:

an N order band pass digital filter 121 for filtering an input digital signal in accordance with filter coefficients $\{a_{k1}, a_{k2}$ and $b_{k1}\}$ ($k=1, 2, \ldots, N/2$; N is an even number), and for outputting the filtered signal;

a first memory 113 for storing filter coefficients $\{a_{k1}(B_a), a_{k2}(B_a)$ and $b_{k1}(B_a)\}$ and $\{a_{k1}(B_b), a_{k2}(B_b)$ and $b_{k1}(B_b)\}$ of the known band pass digital filter having a constant center frequency whose pass band widths are $B_a$ and $B_b$, and filter coefficients $\{a_{k1}(B_r), a_{k2}(B_r)$ and $b_{k1}(B_r)\}$ of the known band pass digital filter having the constant center frequency whose pass band width is $B_r$;

a second memory 115 for storing linear coefficients $K_{akj}$ and $K_{bk1}$, which are calculated in accordance with equations (3) and (4) by using the filter coefficients stored in the first memory 113;

$$K_{akj}=[a_{kj}(B_b)-a_{kj}(B_a)]/(B_b-B_a)$$

$$k=1, 2, \ldots N/2\ j=1, 2 \qquad (3)$$

$$K_{bk1}=[b_{k1}(B_b)-b_{k1}(B_a)]/(B_b-B_a)$$

$$k=1, 2, \ldots N/2 \qquad (4)$$

displacement setting means SV for setting displacement $m\Delta B$ between target pass band width and predetermined pass band width $B_r$ of said band pass digital filter 121;

multiplication means 117 for obtaining $m\Delta B \cdot K_{akj}$ and $m\Delta B \cdot K_{bk1}$ by multiplying the displacement $m\Delta B$, supplied from said displacement setting means SV, by the linear coefficients $K_{akj}$ and $K_{bk1}$ stored in said second memory 115;

adding means 119 for obtaining $a_{k1}(B_r)+m\Delta B \cdot K_{ak1}$, $a_{k2}(B_r)+m\Delta B \cdot K_{ak2}$, and $b_{k1}(B_r)+m\Delta B \cdot K_{bk1}$ by adding the products obtained by said multiplication means 117 to a corresponding one of the filter coefficients stored in said first memory 113; and setting means 111 for setting the pass band width of said band pass digital filter 121 to $B_r+m\Delta B$ by setting the values $a_{k1}(B_r)+m\Delta B \cdot K_{ak1}$, $a_{k2}(B_r)+m\Delta B \cdot K_{ak2}$, and $b_{k1}(B_r)+m\Delta B \cdot K_{bk1}$, obtained by said adding means 119, as the filter coefficients $\{a_{k1}, a_{k2}$ and $b_{k1}\}$ of said band pass digital filter 121.

According to the technique disclosed in the above described patent, the position or the width of the pass band of the digital filter can be varied with a relatively smaller memory capacity and less calculation.

According to the digital filter system disclosed in the above described patent, the filter coefficients are obtained by linear approximation.

When the position or the width of the pass band changes relatively large, however, the filter coefficients change non-linearly. Therefore, an error between the calculated filter coefficients and the ideal filter coefficients occurs. Because of the error, the filter characteristics are degraded.

For example, FIG. 5 exemplifies the changes in the filter coefficients when the pass band width is changed. It is apparent from FIG. 5 that the filter coefficients change non-linearly when the pass band width is changed greatly, and the error occurs when the filter coefficients are set by linear approximation.

Further, it is desired that the amount of data and the amount of calculation, necessary for obtaining the filter coefficients, are decreased.

Also desired are a high pass digital filter system which can exactly change lower limit frequencies of the pass band with less calculation, as well as the variable band width type band pass digital filter system, and a low pass digital filter system which can change upper limit frequencies of the pass band.

SUMMARY OF THE INVENTION

Accordingly, an object of the present invention is to provide a digital filter system which can change pass band characteristics such as the position and width of the pass band thereof with less calculation, decline of the characteristics and a smaller memory capacity.

To achieve the object, a digital filter system which can vary at least one of the position and the width of the pass band, according to the first aspect of the present invention, comprises:

a digital filter for filtering an input digital signal in accordance with filter coefficients $\{a_{k1}, a_{k2}, b_{00}, b_{k1}, b_{k2}, c$ and $d\}$ (k=1, 2, . . . ,N/2; N is an even number), and for outputting the filtered signal;

calculation means for calculating each of the filter coefficients $\{a_{k1}, a_{k2}, b_{00}, b_{k1}, b_{k2}, c$ and $d\}$ in accordance with equations (5) to (11) by using pass band position data x and pass band width data y; and setting means for setting the filter coefficients calculated by said calculation means to said digital filter.

$$a_{k1} = \sum_{i=0}^{L} P_{ak1i} y^i + \sum_{j=1}^{M} Q_{ak1j} x^j \quad (5)$$

$$a_{k2} = \sum_{i=0}^{L} P_{ak2i} y^i + \sum_{j=1}^{M} Q_{ak2j} x^j \quad (6)$$

$$b_{00} = \sum_{i=0}^{L} P_{b00i} y^i + \sum_{j=1}^{M} Q_{b00j} x^j \quad (7)$$

$$b_{k1} = \sum_{i=0}^{L} P_{bk1i} y^i + \sum_{j=1}^{M} Q_{bk1j} x^j \quad (8)$$

$$b_{k2} = \sum_{i=0}^{L} P_{bk2i} y^i + \sum_{j=1}^{M} Q_{bk2j} x^j \quad (9)$$

$$c = \sum_{i=0}^{L} P_{ci} y^i + \sum_{j=1}^{M} Q_{cj} x^j \quad (10)$$

$$d = \sum_{i=0}^{L} P_{di} y^i + \sum_{j=1}^{M} Q_{dj} x^j \quad (11)$$

Where "L" and "M" are orders for approximation, and $P_{b00i}, Q_{b00j}, P_{bk1i}, Q_{bk1j}, P_{bk2i}, Q_{bk2j}, P_{ak1i}, Q_{ak1i}, P_{ak2i}, Q_{ak2j}, P_{ci}, Q_{cj}, P_{di}$ and $Q_{di}$ are constants.

According to the above described structure, the filter coefficients are calculated almost exactly following the changes of position data (for example, the upper limit frequency, the lower limit frequency, or the central frequency of the pass band) and width data of the pass band, because the filter coefficients are calculated based on the equations (5) to (11). Therefore, the digital filter, to which these filter coefficients are set, can obtain the desired characteristics.

Said calculation means comprises a memory for storing, for example, the plurality of constants ($P_{b00i}, Q_{b00j}, P_{bk1j}, Q_{bk1j}, P_{bk2i}, Q_{bk2j}, P_{ak1i}, Q_{ak1j}, P_{ak2i}, Q_{ak2j}, P_{ci}, Q_{cj}, P_{di}$, and $Q_{dj}$), and means for reading out the plurality of constants stored in said memory and for calculating the filter coefficients based on said equations (5) to (11).

The constants, for example, are selected so that the sum of the squares of the errors between the actual filter coefficients, calculated by using the constants and combinations of x and y, and the actual filter coefficients of the digital filter for the combinations of x and y becomes the least or the minimum. And the selected constants are stored in the memory.

The transfer function of said digital filter is represented, for example, as equation (12).

$$G(z) = b_{00} \cdot \frac{1 + dz^{-1}}{1 - cz^{-1}} \cdot \prod_{k=1}^{N/2} \frac{1 + b_{k1} z^{-1} + b_{k2} z^{-2}}{1 - a_{k1} z^{-1} - a_{k2} z^{-2}} \quad (12)$$

When said digital filter comprises a band pass digital filter, the pass band position data x is data for a lower limit frequency, an upper limit frequency, or a center frequency of the pass band.

When the digital filter comprises a low pass digital filter or a high pass digital filter, the pass band position data x is data for an upper limit frequency or a lower limit frequency of the pass band, and said pass band width data y is a constant.

A digital filter system which can vary at least one of the position and the width of a pass band, according to the second aspect of the present invention comprises:

a digital filter for filtering an input digital signal in accordance with filter coefficients $FC_h$ (h=1, 2, . . . , n; n is a natural number), and for outputting the filtered signal;

calculation means for calculating the filter coefficients $FC_h$ in accordance with equation (13) by using pass band position data x and pass band width data y; and setting means for setting the filter coefficients $FC_h$ calculated by said calculation means to said digital filter.

$$FC_h = \sum_{i=0}^{L} S_{hi} y^i + \sum_{j=1}^{M} T_{hj} x^j \quad (13)$$

Where "L" and "M" are orders, and $S_{hi}$ and $T_{hj}$ are predetermined constants.

According to this structure, the filter coefficients are calculated almost exactly following the changes of position data x of the pass band and width data y of the pass band, because filter coefficients $FC_h$ are calculated based on the equation (13). Therefore, the digital filter, to which these filter coefficients are set, can obtain the desired characteristics.

Said calculation means comprises, for example, memory means for storing the constants $S_{hi}$ and $T_{hj}$, and means for inputting the pass band position data x and pass band width data y, and reading out the constants $S_{hi}$ and $T_{hj}$ from said memory means and calculating the filter coefficients $FC_h$ based on the position data x, width data y, and constants $S_{hi}$ and $T_{hj}$.

The constants $S_{hi}$ and $T_{hj}$, for example, are selected so that the sum of the squares of the errors between the filter coefficients, calculated by using sets of the constants, x and y, and actual filter coefficients of said digital filter to the x and y, becomes the least or the minimum. And the selected constants are stored in said memory means.

A digital filter system according to the third aspect of the present invention comprises:

a digital filter for filtering an input digital signal in accordance with filter coefficients, and for outputting the filtered signal;

parameter storage means for storing parameters for calculating said filter coefficients defined by a non-linear polynomial for the position and/or the width of the pass band of said digital filter;

filter coefficient calculation means for calculating said filter coefficients, based on said parameters stored in said parameter storage means, and a target position and/or a target width for the pass band of said digital filter; and setting means for setting the filter coefficients calculated by said filter coefficient calculation means to said digital filter.

According to this structure, the filter coefficients are calculated almost exactly following the changes of the position data of the pass band and/or the width data of the pass band, because the filter coefficients are calculated based on the non-linear polynomial. Therefore, the digital filter, to which these filter coefficients are set, can obtain the desired characteristics.

DETAILED DESCRIPTION OF THE PREFERRED EMBODIMENTS

A digital filter system embodying the present invention will now be described with reference to the accompanying drawings. The term "frequency" as used in the descriptions below means normalized frequency.

Figure 1:
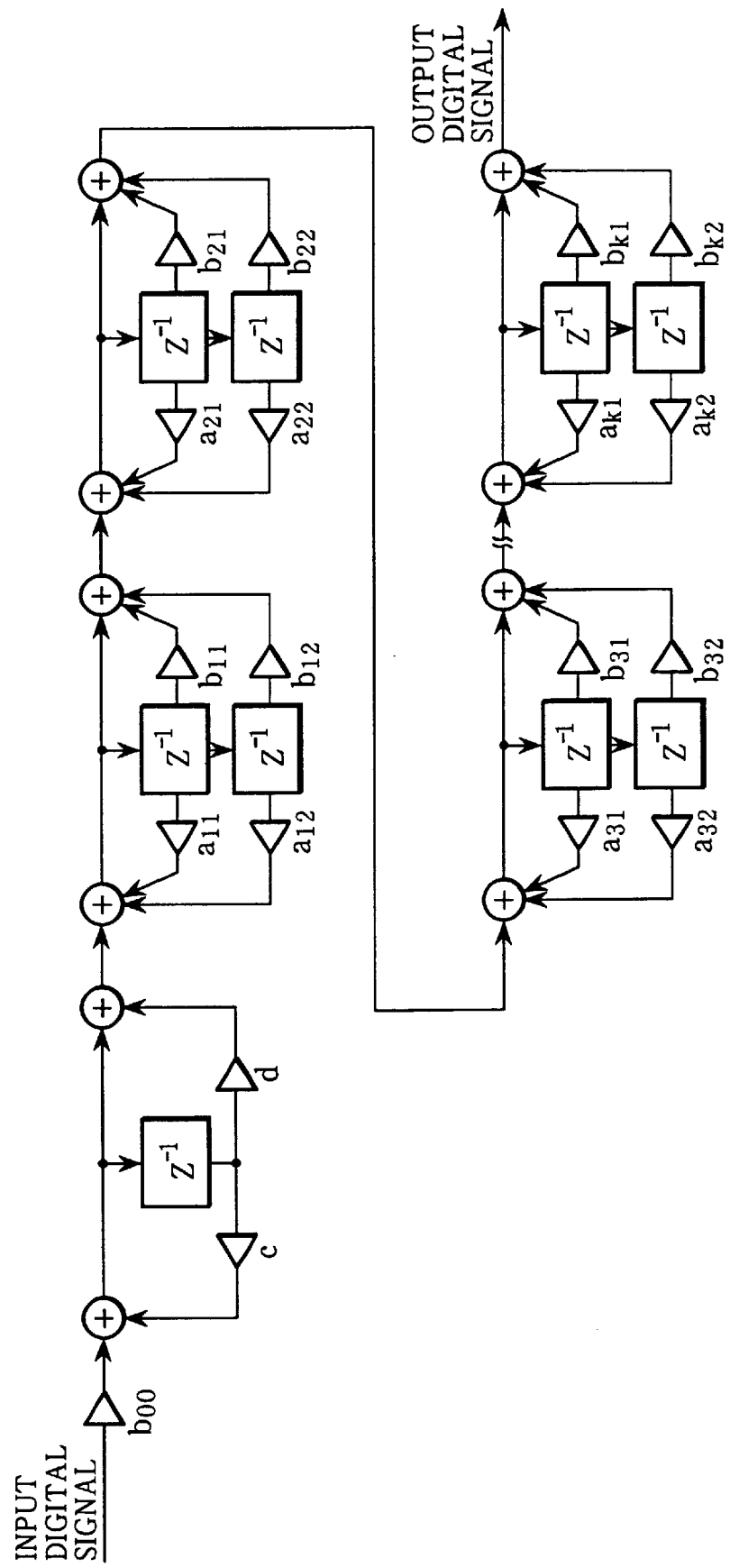
FIG. 1 is a diagram showing the basic structure of an IIR type digital filter.

FIG. 1 exemplifies an IIR type digital filter formed by connecting a first order IIR filter section and N/2 second order IIR filter sections in series.

When at least one of filter coefficients c and d shown in FIG. 1 is not 0, the digital filter becomes (N+1)-th order which is an odd numbered order, and when both of the filter coefficients c and d are 0, the digital filter becomes N-th order which is an even numbered order.

Generally, a low pass filter and a high pass filter are odd numbered orders, and a band pass filter and a notch filter are even numbered orders. The orders, however, are not limited to these.

A transfer function of the digital filter shown in FIG. 1 is represented as equation (14) approximately.

$$G(z) = b_{00} \cdot \frac{1 + dz^{-1}}{1 - cz^{-1}} \cdot \prod_{k=1}^{N/2} \frac{1 + b_{k1}z^{-1} + b_{k2}z^{-2}}{1 - a_{k1}z^{-1} - a_{k2}z^{-2}} \quad (14)$$

Given that an arbitrary value for the pass band position data is x, and an arbitrary value for the band width data is y, each of the filter coefficients are represented as equations (15) to (21).

In case of the band pass filter, the pass band position data x indicates the position of the pass band, for example, the lower limit frequency, upper limit frequency or central frequency of the pass band. The band width data y indicate the width of the pass band, namely difference between the upper limit frequency and lower limit frequency.

In case of the low pass filter, the pass band position data x indicate the upper limit frequency of the pass band, and the band width data y is a constant. In case of the high pass filter, the pass band position data x indicate the lower limit frequency of the pass band, and the band width data y is a constant.

$$a_{k1} = \sum_{i=0}^{L} P_{ak1i} y^i + \sum_{j=1}^{M} Q_{ak1j} x^j \quad (15)$$

$$a_{k2} = \sum_{i=0}^{L} P_{ak2i} y^i + \sum_{j=1}^{M} Q_{ak2j} x^j \quad (16)$$

$$b_{00} = \sum_{i=0}^{L} P_{b00i} y^i + \sum_{j=1}^{M} Q_{b00j} x^j \quad (17)$$

$$b_{k1} = \sum_{i=0}^{L} P_{bk1i} y^i + \sum_{j=1}^{M} Q_{bk1j} x^j \quad (18)$$

$$b_{k2} = \sum_{i=0}^{L} P_{bk2i} y^i + \sum_{j=1}^{M} Q_{bk2j} x^j \quad (19)$$

$$c = \sum_{i=0}^{L} P_{ci} y^i + \sum_{j=1}^{M} Q_{cj} x^j \quad (20)$$

$$d = \sum_{i=0}^{L} P_{di} y^i + \sum_{j=1}^{M} Q_{dj} x^j \quad (21)$$

Where "L" and "M" are orders of approximate expressions for polynomial approximation.

$P_{b00i}$, $Q_{b00j}$, ..., $P_{ak2i}$, $Q_{ak2j}$, $P_{ci}$, $Q_{cj}$, $P_{di}$, and $Q_{dj}$ are constants and coefficients of equations to output $b_{00}$, $b_{k1}$, $b_{k2}$, $a_{k1}$, $a_{k2}$, c, and d respectively when the pass band position data x and band width data y are input.

Constants $P_{b00i}$, $Q_{b00j}$, ..., $P_{ak2i}$, $Q_{ak2j}$, $P_{ci}$, $Q_{cj}$, $P_{di}$, and $Q_{dj}$ can be obtained by using the least square approximation method to decide the total errors of the filter coefficients to be the least (the minimum).

For example, given that L=2 and M=1, coefficients $b_0$, $b_{k1}$, $b_{k2}$, $a_{k1}$, $a_{k2}$, c, and d can be approximated by equations (22) to (28).

$$b_{00} \approx P_{b002} y^2 + P_{b001} y + P_{b000} y^0 + Q_{b001} x \quad (22)$$

$$b_{k1} \approx P_{bk12} y^2 + P_{bk11} y + P_{bk10} y^0 + Q_{bk11} x \quad (23)$$

$$b_{k2} \approx P_{bk22} y^2 + P_{bk21} y + P_{bk20} y^0 + Q_{bk21} x \quad (24)$$

$$a_{k1} \approx P_{ak12} y^2 + P_{ak11} y + P_{ak10} y^0 + Q_{ak11} x \quad (25)$$

$$a_{k2} \approx P_{ak22} y^2 + P_{ak21} y + P_{ak20} y^0 + Q_{ak21} x \quad (26)$$

$$c \approx P_{c2} y^2 + P_{c1} y + P_{c0} y^0 + Q_{c1} x \quad (27)$$

$$d \approx P_{d2} y^2 + P_{d1} y + P_{d0} y^0 + Q_{d1} x \quad (28)$$

Figure 2:
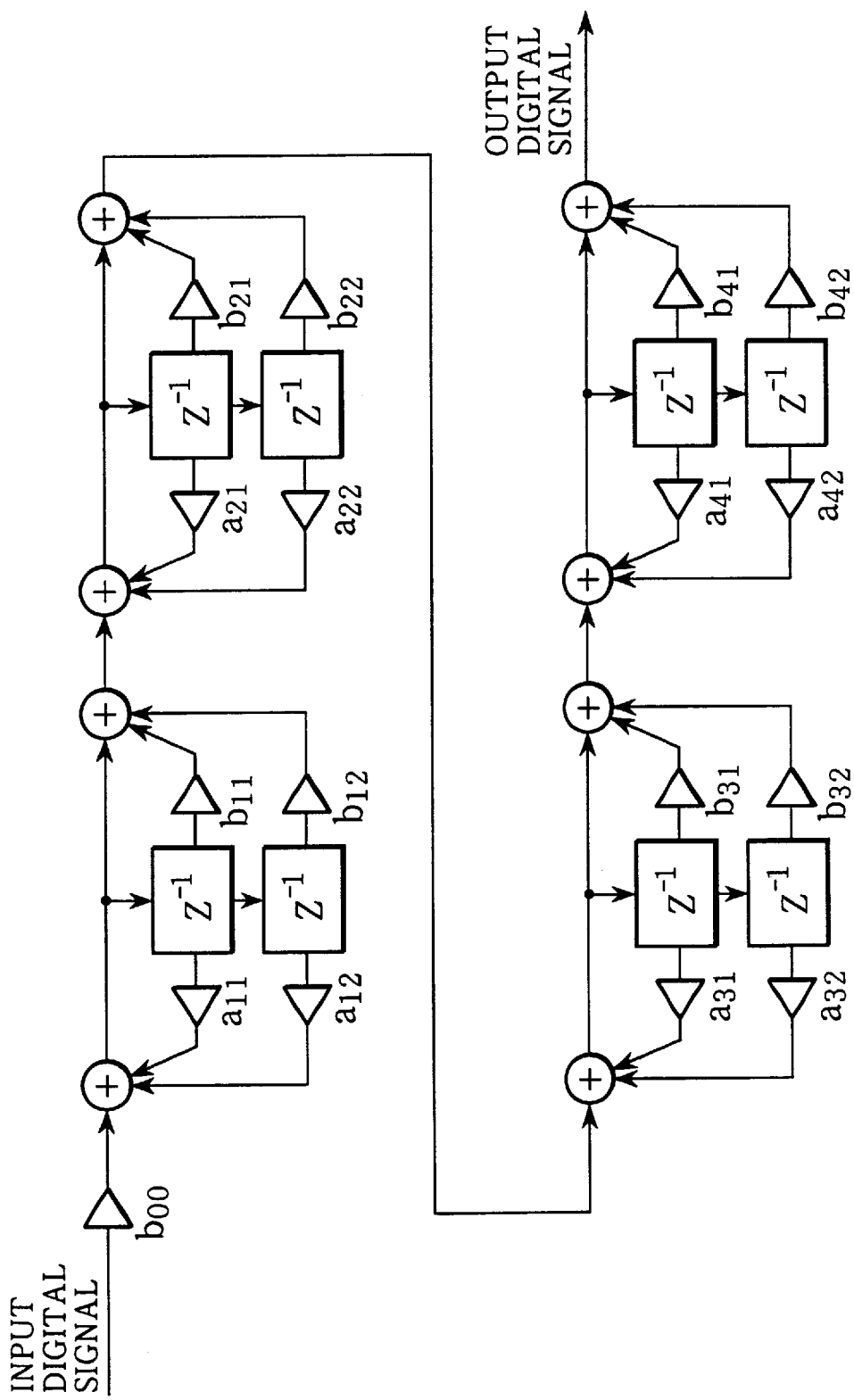
FIG. 2 is a diagram exemplifying the structure of an eighth order IIR type digital filter.

When the IIR type digital filter shown in FIG. 1 is an eighth order IIR type band pass ellipse digital filter which comprises 4 (=8/2) second order IIR filter sections connected in series as shown in FIG. 2, equation (14) can be exchanged with equation (29), and equations (22) to (28) can be exchanged with equations (30) to (36).

$$G(z) = b_{00} \cdot \prod_{k=1}^{4} \frac{1 + b_{k1}z^{-1} + b_{k2}z^{-2}}{1 - a_{k1}z^{-1} - a_{k2}z^{-2}} \quad (29)$$

$$b_{00} \approx P_{b002} y^2 + P_{b001} y + P_{b000} \quad (30)$$

$$b_{k1} \approx P_{bk12} y^2 + P_{bk11} y + Q_{bk11} x' P_{bk10} \quad (31)$$

$$b_{k2} \approx 1.0 \quad (32)$$

$$a_{k1} \approx P_{ak11}y + Q_{ak11}x + P_{ak10} \quad (33)$$

$$a_{k2} \approx P_{ak21}y + P_{ak20} \quad (34)$$

$$c = 0 \quad (35)$$

$$d = 0 \quad (36)$$

For example, equation (31) can be exchanged with equation (37) by using coefficients A, B, C and D.

$$b_{k1} \approx P_{bk12}y^2 + P_{bk11}y + Q_{bk11}x + P_{bk10} \quad (37)$$
$$\approx Ay^2 + By + C + Dx$$

An error e, between $b_{k1}$ calculated by equation (37) for a given x and y, and known actual $b_{k1R}$ of the digital filter shown in FIG. 2 corresponding to the given x and y, can be expressed by equation (38), and $e^2$, the square thereof, can be expressed by equation (39). Therefore, the total of the squares of errors can be represented as equation (40).

$$e = Ay^2 + By + C + Dx - b_{k1R} \quad (38)$$

$$e^2 = \{Ay^2 + By + C + Dx - b_{k1R}\}^2 \quad (39)$$

$$E = \sum_{i=1}^{n} e_i^2 = \sum_{i=1}^{n} \{Ay_i^2 + By_i + C + Dx_i - b_{k1Ri}\}^2 \quad (40)$$

Where "n" is the number of combinations of x, y and actual filter coefficient $b_{k1R}$ for approximation.

As shown in equations (41) to (44), "E" is differentiated by A, B, C and D so that it is the least (or the minimum).

$$\frac{\partial E}{\partial A} = 2 \sum_{i=1}^{n} y_i^2 (Ay_i^2 + By_i + C + Dx_i - b_{k1Ri}) \quad (41)$$
$$= 2 \sum_{i=1}^{n} Ay_i^4 + 2 \sum_{i=1}^{n} By_i^3 + 2 \sum_{i=1}^{n} Cy_i^2 +$$
$$2 \sum_{i=1}^{n} Dx_i y_i^2 - 2 \sum_{i=1}^{n} y_i^2 b_{k1Ri}$$

$$\frac{\partial E}{\partial B} = 2 \sum_{i=1}^{n} y_i (Ay_i^2 + By_i + C + Dx_i - b_{k1Ri}) \quad (42)$$
$$= 2 \sum_{i=1}^{n} Ay_i^3 + 2 \sum_{i=1}^{n} By_i^2 + 2 \sum_{i=1}^{n} Cy_i + 2 \sum_{i=1}^{n} Dx_i y_i -$$
$$2 \sum_{i=1}^{n} y_i b_{k1Ri}$$

$$\frac{\partial E}{\partial C} = 2 \sum_{i=1}^{n} (Ay_i^2 + By_i + C + Dx_i - b_{k1Ri}) \quad (43)$$
$$= 2 \sum_{i=1}^{n} Ay_i^2 + 2 \sum_{i=1}^{n} By_i + 2nC + 2 \sum_{i=1}^{n} Dx_i - 2 \sum_{i=1}^{n} b_{k1Ri}$$

$$\frac{\partial E}{\partial D} = 2 \sum_{i=1}^{n} x_i (Ay_i^2 + By_i + C + Dx_i - b_{k1Ri}) \quad (44)$$
$$= 2 \sum_{i=1}^{n} Ax_i y_i^2 + 2 \sum_{i=1}^{n} Bx_i y_i + 2 \sum_{i=1}^{n} Cx_i + 2 \sum_{i=1}^{n} Dx_i^2 -$$
$$2 \sum_{i=1}^{n} x_i b_{k1Ri}$$

In equations (41) to (44), conditions by which the total of the errors E becomes the least, each of A, B, C and D is introduced, as shown in equation (45), by setting each differentiated value to 0.

$$\begin{bmatrix} \sum_{i=1}^{n} y_i^2 b_{k1Ri} \\ \sum_{i=1}^{n} y_i b_{k1Ri} \\ \sum_{i=1}^{n} b_{k1Ri} \\ \sum_{i=1}^{n} x_i b_{k1Ri} \end{bmatrix} = \begin{bmatrix} \sum_{i=1}^{n} y_i^4 & \sum_{i=1}^{n} y_i^3 & \sum_{i=1}^{n} y_i^2 & \sum_{i=1}^{n} x_i y_i^2 \\ \sum_{i=1}^{n} y_i^3 & \sum_{i=1}^{n} y_i^2 & \sum_{i=1}^{n} y_i & \sum_{i=1}^{n} x_i y_i \\ \sum_{i=1}^{n} y_i^2 & \sum_{i=1}^{n} y_i & n & \sum_{i=1}^{n} x_i \\ \sum_{i=1}^{n} x_i y_i^2 & \sum_{i=1}^{n} x_i y_i & \sum_{i=1}^{n} x_i & \sum_{i=1}^{n} x_i^2 \end{bmatrix} \begin{bmatrix} A \\ B \\ C \\ D \end{bmatrix} \quad (45)$$

Equation (46) is obtained from equation (56), and coefficients A, B, C and D can be obtained by solving equation (46).

$$\begin{bmatrix} A \\ B \\ C \\ D \end{bmatrix} = \begin{bmatrix} \sum_{i=1}^{n} y_i^4 & \sum_{i=1}^{n} y_i^3 & \sum_{i=1}^{n} y_i^2 & \sum_{i=1}^{n} x_i y_i^2 \\ \sum_{i=1}^{n} y_i^3 & \sum_{i=1}^{n} y_i^2 & \sum_{i=1}^{n} y_i & \sum_{i=1}^{n} x_i y_i \\ \sum_{i=1}^{n} y_i^2 & \sum_{i=1}^{n} y_i & n & \sum_{i=1}^{n} x_i \\ \sum_{i=1}^{n} x_i y_i^2 & \sum_{i=1}^{n} x_i y_i & \sum_{i=1}^{n} x_i & \sum_{i=1}^{n} x_i^2 \end{bmatrix}^{-1} \begin{bmatrix} \sum_{i=1}^{n} y_i^2 b_{k1Ri} \\ \sum_{i=1}^{n} y_i b_{k1Ri} \\ \sum_{i=1}^{n} b_{k1Ri} \\ \sum_{i=1}^{n} x_i b_{k1Ri} \end{bmatrix} \quad (46)$$

The filter coefficient $b_{k1}$ can be obtained from equation (37) by using coefficients A, B, C and D, obtained by solving equation (46), the pass band position data x, and the pass band width data y.

Filter coefficients $b_{00}$, $b_{k2}$, $a_{k1}$, $a_{k2}$, c, and d can be obtained in the same manner.

A digital filter with a desired pass band position x and pass band width y can be obtained by setting the obtained filter coefficients $b_{00}$, $b_{k1}$, $b_{k2}$, $a_{k1}$, $a_{k2}$, c, and d to each of the multipliers shown in FIGS. 1 and 2, as multiplier factors.

In case of the low pass digital filter and the high pass digital filter, constants $P_{b00i}$, $P_{bk1i}$, $P_{bk2i}$, $P_{ak1i}$, $P_{ak2i}$, $P_{ci}$, $P_{di}$, $Q_{b00i}$, $Q_{bk1i}$, $Q_{bk2i}$, $Q_{ak1i}$, $Q_{ak2i}$, $Q_{ci}$ and $Q_{di}$ for calculating filter coefficients are also previously obtained from the filter coefficients of the known digital filter. Then, the filter coefficients $b_{00}$, $b_{k1}$, $b_{k2}$, $a_{k1}$, $a_{k2}$, c, and d are obtained by using these constants and the position data x of the pass band. The pass band width data y is a constant. Therefore, the terms "P" are constants. And a low pass digital filter and a high pass digital filter having a desired pass band position x can be obtained by setting the obtained filter coefficients to each of the multipliers, shown in FIG. 1, as multiplier factors.

The structure of a band pass digital filter system which can vary the center frequency and pass band width by using the above described method will now be described with reference to FIG. 3.

Figure 3:
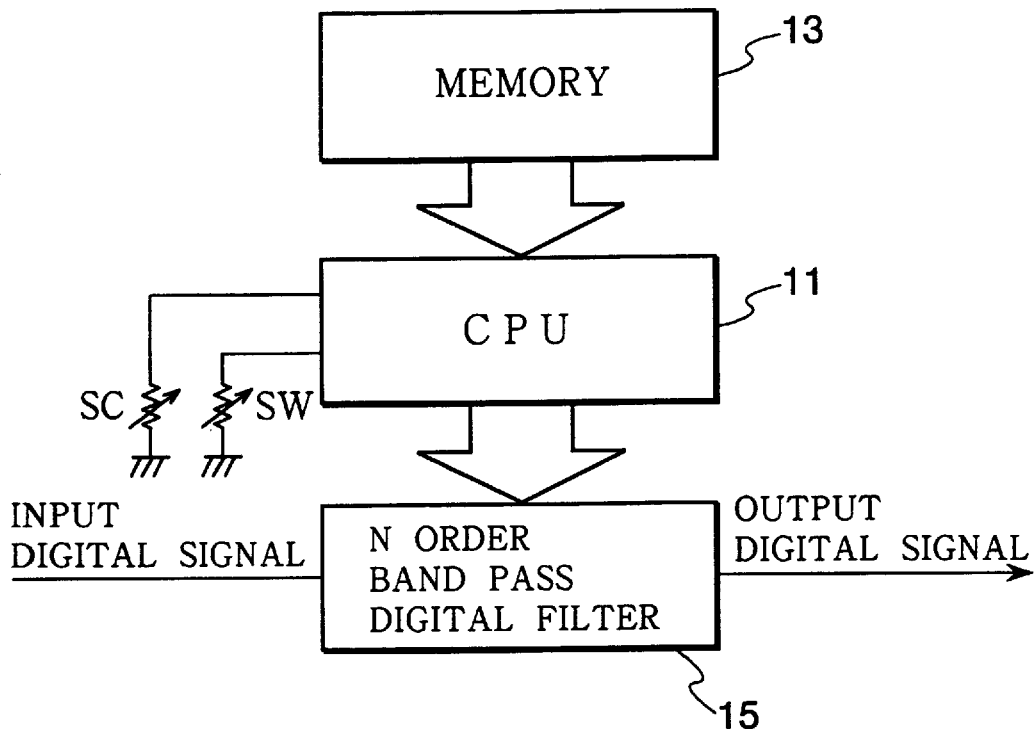
FIG. 3 is a block diagram showing the structure of a digital filter system according to one embodiment of this invention.

As shown in FIG. 3, a band pass digital filter system comprises a CPU 11, a memory 13, an N-th order IIR type band pass digital filter 15, a shift knob SC for changing the center frequency of the pass band, and a shift knob SW for changing the pass band width.

The band pass digital filter 15, for example, comprises the structure shown in FIG. 1, and takes the filter coefficients $\{a_{k1}, a_{k2}, b_{00}, b_{k1}, b_{k2}, c$ and $d\}$, supplied from the CPU 11, to filter an input digital signal in accordance with the filter coefficients. A digital signal supplied to the band pass digital filter 15 is obtained, for example, by A/D conversion of an analog audio signal at an arbitrary sampling frequency. A digital signal output from the band pass digital filter 15 is supplied to, for example, an analog circuit after being subjected to D/A conversion.

The memory 13 stores coefficients $P_{b00i}$, $Q_{b00j}$, ..., $P_{ak2i}$, $Q_{ak2j}$, $P_{ci}$, $Q_{cj}$, $P_{di}$, and $Q_{dj}$ to be used for calculating filter coefficients $b_{00}$, $b_{k1}$, $b_{k2}$, $a_{k1}$, $a_{k2}$, c and d by equations (15) to (21). Each of the coefficients $P_{b00i}$, $Q_{b00j}$, ..., $P_{ak2i}$, $Q_{ak2j}$, $P_{ci}$, $Q_{ci}$, $P_{di}$, and $Q_{dj}$ are previously calculated with equations (22) to (46) using, for example, pass band center frequency x, pass band width y, and the filter coefficients $b_{00R}$, $b_{k1R}$, $b_{k2R}$, $a_{k1R}$, $a_{k2R}$, $c_R$ and $d_R$ of a band pass digital filter with known characteristics and the calculated coefficients are set in the memory 13.

The memory 13 further stores program for calculating the filter coefficients $b_{00}$, $b_{k1}$, $b_{k2}$, $a_{k1}$, $a_{k2}$, c and d, and for setting the calculated coefficients to the digital filter 15.

Designation values of the shift knobs SC and SW, are supplied to the CPU 11 after being converted to digital data by an unillustrated A/D converter or the like. A user informs desired center frequency x (normalized frequency based on sampling frequency) for the pass band of the digital filter system to the CPU 11 by operating the shift knob SC, and informs the pass band width y (normalized frequency based on sampling frequency) to the CPU 11 by operating the shift knob SW.

The CPU 11 operates in accordance with the program stored in the memory 13, and controls the operation of the whole digital filter system. Every time a new central frequency x and pass band width y are designated by means of the shift knobs SC and SW, the CPU 11 calculates the filter coefficients $b_{00}$, $b_{k1}$, $b_{k2}$, $a_{k1}$, $a_{k2}$, c and d of equations (15) to (21) by using the coefficients (constants) $P_{b00i}$, $Q_{b00j}$, ..., $P_{ak2i}$, $Q_{ak2j}$, $P_{ci}$, $Q_{cj}$, $P_{di}$, and $Q_{dj}$ stored in the memory 13, and sets the results to the digital filter 15.

According to the structure, the position and width of the pass band can be changed with less deterioration of the characteristics by operating the knobs SC and SW.

In case of a low pass digital filter and a high pass digital filter, each of the coefficients $P_{b00i}$, $Q_{b00j}$, ..., $P_{ak2i}$, $Q_{ak2j}$, $P_{ci}$, $Q_{cj}$, $P_{di}$, and $Q_{dj}$, for calculating the filter coefficients $b_{00}$, bk1, $b_{k2}$, $a_{k1}$, $a_{k2}$, c and d with equations 15 to 21 are previously obtained from filter coefficients of a low pass digital filter and a high pass digital filter with known characteristics and are stored in the memory 13. The CPU 11 calculates the filter coefficients $b_{00}$, $b_{k1}$, $b_{k2}$, $a_{k1}$, $a_{k2}$, c and d by using each of the coefficients $P_{b00i}$, $Q_{b00j}$, ..., $P_{ak2i}$, $Q_{ak2j}$, $P_{ci}$, $Q_{cj}$, $P_{di}$, and $Q_{dj}$ and the upper limit frequency or lower limit frequency x of the pass band. And sets the results to the digital filter 15. In this case, the shift knob SW is not used.

According to this embodiment, the only data that need to be stored in the memory 13 are the constants $P_{b00i}$, $Q_{b00j}$, ..., $P_{ak2i}$, $Q_{ak2j}$, $P_{ci}$, $Q_{cj}$, $P_{di}$, and $Q_{dj}$ in case of the band pass filter, and the constants $P_{b00i}$, $Q_{b00j}$, ..., $P_{ak2i}$, $Q_{ak2j}$, $P_{ci}$, $Q_{ci}$, $P_{di}$, and $Q_{dj}$ in case of the low pass filter and the high pass filter. Therefore, a digital filter system, which needs a smaller memory capacity and less calculation, and has an arbitrary position and width for the pass band, can be obtained.

Figure 4:
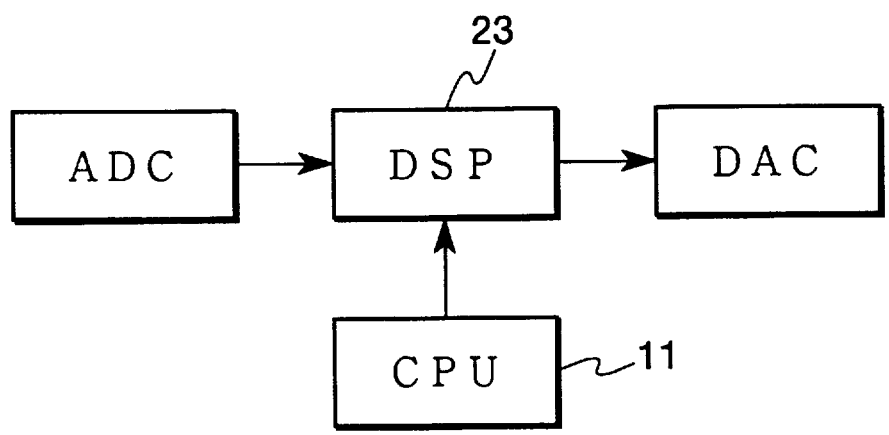
FIG. 4 is a diagram exemplifying a modification of the digital filter system shown in FIG. 3.
Figure 5:
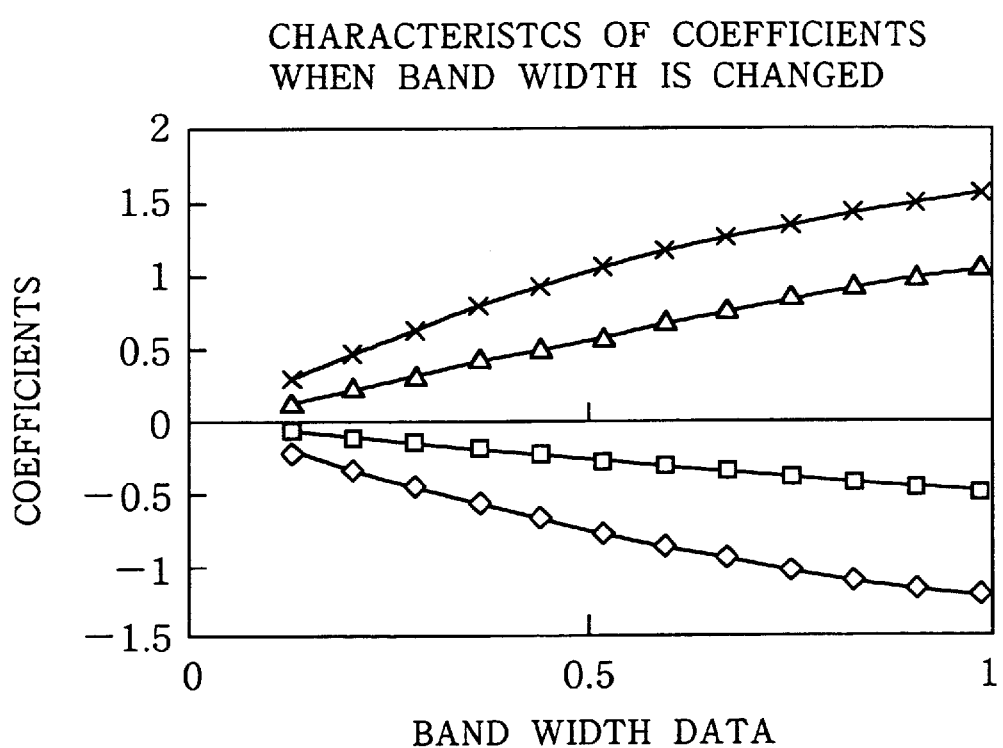
FIG. 5 is a diagram showing how changes in the filter characteristics correspond to changes in the width of the pass band.
Figure 6:
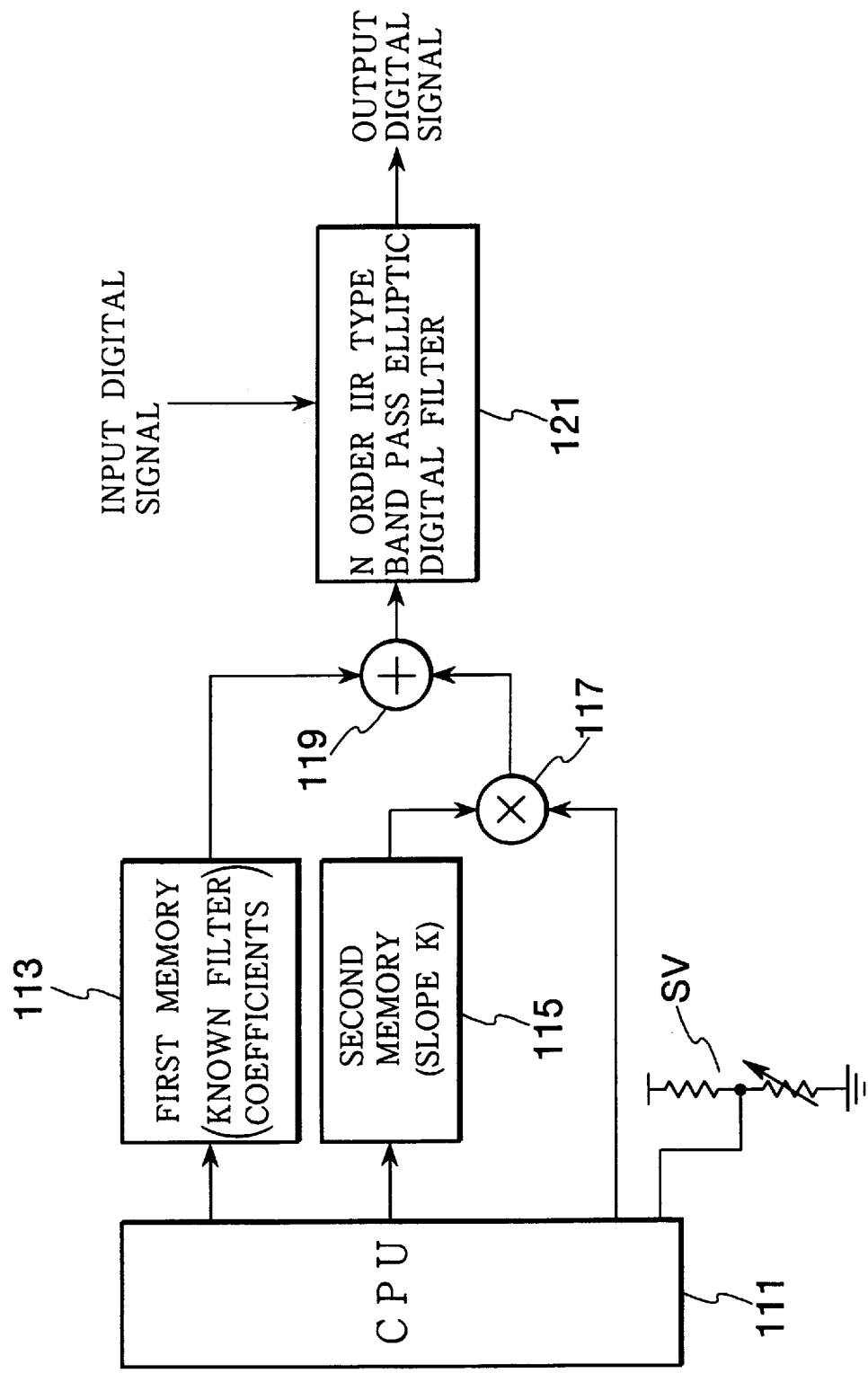
FIG. 6 is a block diagram showing the structure of a conventional digital filter system which can change pass band width and pass band position.

The present invention is not limited to the above described embodiment, and various modifications and a variety of applications are possible. For example, although the memory 13 and the band pass filter 15 are constructed as separate hardware components, they may be constructed as a DSP (Digital Signal Processor) 23 as shown in FIG. 4.

The orders "L" and "M" are arbitrary values L=2 and M=0 may be adopted for example.

The pass band position data x does not need to be the center frequency of the pass band, it may be the upper limit frequency or the lower limit frequency.

The digital filter is not limited to the structure shown in FIG. 1, and it is arbitrary. The present invention may be adapted to a digital filter for outputting an input digital signal after filtering is performed in accordance with arbitrary filter coefficients $FC_h$ (h=1, 2, ..., n; n is a natural number). In this case, a digital filter having arbitrary filter characteristics can be obtained by setting the filter coefficients $FC_h$, calculated by using the pass band position data x and pass band width data y in accordance with equation (47), to the digital filter.

In this case, constants $S_{hi}$ and $T_{hi}$, which are previously obtained from filter coefficients for a known digital filter, are stored in the memory.

$$FC_h = \sum_{i=0}^{L} S_{hi} y^i + \sum_{j=1}^{M} T_{hj} x^j \tag{47}$$

As stated above, according to the present invention, a digital filter system, having a goal pass band position and/or a goal pass band width, for which a smaller memory capacity and less calculation, can be obtained.

What is claimed is:

1. A digital filter system which can vary at least one of position and width of a pass band thereof, comprising:

a digital filter for filtering an input digital signal in accordance with filter coefficients $\{a_{k1}, a_{k2}, b_{00}, b_{k1}, b_{k2}, c \text{ and } d\}$ (k=1, 2, ..., N/2; N is an even number), and for outputting the filtered signal;

calculation means for calculating each of the filter coefficients $\{a_{k1}, a_{k2}, b_{00}, b_{k1}, b_{k2}, c \text{ and } d\}$ in accordance with equations (48) to (54) by using pass band position data x and pass band width data y; and setting means for setting the filter coefficients calculated by said calculation means to said digital filter;

$$a_{k1} = \sum_{i=0}^{L} P_{ak1i} y^i + \sum_{j=1}^{M} Q_{ak1j} x^j \tag{48}$$

$$a_{k2} = \sum_{i=0}^{L} P_{ak2i} y^i + \sum_{j=1}^{M} Q_{ak2j} x^j \tag{49}$$

$$b_{00} = \sum_{i=0}^{L} P_{b00i} y^i + \sum_{j=1}^{M} Q_{b00j} x^j \tag{50}$$

$$b_{k1} = \sum_{i=0}^{L} P_{bk1i} y^i + \sum_{j=1}^{M} Q_{bk1j} x^j \tag{51}$$

$$b_{k2} = \sum_{i=0}^{L} P_{bk2i} y^i + \sum_{j=1}^{M} Q_{bk2j} x^j \tag{52}$$

$$c = \sum_{i=0}^{L} P_{ci} y^i + \sum_{j=1}^{M} Q_{cj} x^j \tag{53}$$

$$d = \sum_{i=0}^{L} P_{di} y^i + \sum_{j=1}^{M} Q_{dj} x^j \tag{54}$$

"L" and "M" are the orders for the approximation, and $P_{b00i}$, $Q_{b00j}$, $P_{bk1i}$, $Q_{bk1j}$, $P_{bk2i}$, $Q_{bk2j}$, $P_{ak1i}$, $Q_{ak1j}$, $P_{ak2i}$, $Q_{ak2j}$, $P_{ci}$, $Q_{cj}$, $P_{di}$ and $Q_{dj}$ are constants.

2. The digital filter system according to claim 1, wherein said calculation means comprises a memory for storing said plurality of constants, and means for reading said plurality of constants stored in said memory and for calculating said filter coefficients based on said equations (48) to (54).

3. The digital filter system according to claim 2, wherein said memory stores said constants selected so that the sum of the squares of errors between the filter coefficients calculated by using said constants and given x and y, and actual filter coefficients for said digital filters for the given x and y, becomes the least or the minimum in regard to a plurality of combinations of the x and y.

4. The digital filter system according to claim 1, wherein the transfer function of said digital filter is represented by equation (55);

$$G(z) = b_{00} \cdot \frac{1 + dz^{-1}}{1 - cz^{-1}} \cdot \prod_{k=1}^{N/2} \frac{1 + b_{k1}z^{-1} + b_{k2}z^{-2}}{1 - a_{k1}z^{-1} - a_{k2}z^{-2}} . \quad (55)$$

5. The digital filter system according to claim 1, wherein said digital filter comprises a band pass digital filter; and
said pass band position data x are data for a lower limit frequency, an upper limit frequency or a center frequency of the pass band.

6. The digital filter system according to claim 1, wherein said digital filter comprises a low pass filter or a high pass filter;
said pass band position data x comprises an upper limit frequency or a lower limit frequency of the pass band; and
said pass band width y is a constant.

7. A digital filter system which can vary at least one of a position and a width of a pass band thereof, comprising:
a digital filter for filtering an input digital signal in accordance with a filter coefficient $FC_h$ (h=1, 2, ..., n; n is a natural number), and for outputting the filtered signal;
calculation means for calculating the filter coefficient $FC_h$ in accordance with equation (56) with pass band position data x and pass band width data y; and
setting means for setting the filter coefficient $FC_h$ calculated by said calculation means, to said digital filter;

$$FC_h = \sum_{i=0}^{L} S_{hi} y^i + \sum_{j=1}^{M} T_{hj} x^j \quad (56)$$

"L" and "M" are orders, and $S_{hi}$ and $T_{hj}$ are predetermined constants.

8. The digital filter system according to claim 7, wherein said calculation means includes memory means for storing the constants $S_{hi}$ and $T_{hj}$, and means for calculating the filter coefficients $FC_h$ based on the equation (56) and given inputs x and y.

9. The digital filter system according to claim 8, wherein said memory means stores the constants $S_{hi}$ and $T_{hj}$ so that the sum of the squares of errors between calculated filter coefficients $FC_h$ corresponding to given x and y and actual filter coefficients $FC_h$ corresponding to the given x and y, becomes the least or the minimum.

10. A digital filter system comprising:
a digital filter for filtering an input digital signal in accordance with filter coefficients, and for outputting the filtered signal;
parameter storage means for storing parameters for calculating said filter coefficients which are defined by a non-linear polynomial for a position and/or a width for a pass band of said digital filter;
filter coefficient calculation means for calculating the filter coefficients, based on the parameters stored in said parameter storage means, and the position and/or width of the pass band of said digital filter; and
setting means for setting the filter coefficients calculated by said filter coefficient calculation means to said digital filter.

* * * * *

UNITED STATES PATENT AND TRADEMARK OFFICE
CERTIFICATE OF CORRECTION

PATENT NO. : 5,856,934
DATED : January 5, 1999
INVENTOR(S) : NAKAJIMA et al

It is certified that error appears in the above-identified patent and that said Letters Patent is hereby corrected as shown below:

Title page, Item [56] References Cited, under "U.S. PATENT DOCUMENTS", change "5,687,109" to --5,687,104--;

Column 2, line 41, change, "$...+m\Delta B \cdot K_{k2}$" to --$...+m\Delta B \cdot K_{ak2}$--;

Column 3, line 47, change "$P_{b00i}Q_{b00j}$" to --$P_{b00i}, Q_{b00j}$--;

Column 6, line 38, change "$b_0$" to --$b_{00}$--;

line 66, (equation 31), change "$...+Q_{bk11}x'P_{bk10}$" to --$...+Q_{bk11}x+P_{bk10}$--;

Column 9, line 45, change "bk1" to --$b_{k1}$--.

Signed and Sealed this

Thirteenth Day of March, 2001

Attest:

NICHOLAS P. GODICI

*Attesting Officer*   *Acting Director of the United States Patent and Trademark Office*